(12) United States Patent  
Dinh et al.

(10) Patent No.: US 9,368,206 B1  
(45) Date of Patent: Jun. 14, 2016

(54) CAPACITOR ARRANGEMENTS USING A RESISTIVE SWITCHING MEMORY CELL STRUCTURE

(71) Applicant: Adesto Technologies Corporation, Sunnyvale, CA (US)

(72) Inventors: John Dinh, Dublin, CA (US); Ming Sang Kwan, San Leandro, CA (US); Venkatesh P. Gopinath, Fremont, CA (US); Derric Lewis, Sunnyvale, CA (US); Shane Hollmer, Grass Valley, CA (US); John R. Jameson, Menlo Park, CA (US); Michael Van Buskirk, Saratoga, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 59 days.

(21) Appl. No.: 14/325,119

(22) Filed: Jul. 7, 2014

(51) Int. Cl.
*G11C 13/00* (2006.01)

(52) U.S. Cl.
CPC ........ *G11C 13/0069* (2013.01); *G11C 13/0097* (2013.01)

(58) Field of Classification Search
CPC ................ G11C 13/0069; G11C 13/0097
See application file for complete search history.

(56) References Cited

U.S. PATENT DOCUMENTS

| 6,977,198 | B2 | 12/2005 | Gau | |
|---|---|---|---|---|
| 7,566,628 | B2 | 7/2009 | Liao et al. | |
| 8,450,709 | B2* | 5/2013 | Kusai | G11C 11/5685 257/2 |
| 8,809,159 | B2* | 8/2014 | Wang | H01L 45/1253 438/104 |
| 2008/0273370 | A1* | 11/2008 | Keller | G11C 11/5614 365/148 |
| 2012/0091420 | A1* | 4/2012 | Kusai | G11C 11/5685 257/4 |
| 2012/0127779 | A1* | 5/2012 | Scheuerlein | G11C 5/02 365/148 |
| 2014/0175364 | A1* | 6/2014 | Wang | H01L 45/1253 257/4 |

* cited by examiner

*Primary Examiner* — Jerome Leboeuf
(74) *Attorney, Agent, or Firm* — Michael C. Stephens, Jr.

(57) ABSTRACT

In one embodiment, a capacitive circuit can include: (i) a resistive storage element having a solid electrolyte, a first electrode coupled to a first side of the solid electrolyte, and a second electrode coupled to a second side of the solid electrolyte; (ii) the resistive storage element being configured to be programmed to a low resistance state by application of a program voltage in a forward bias direction to form a conductive path between the first and second electrodes, and being configured to be erased to a high resistance state by application of an erase voltage in a reverse bias direction to substantially dissolve the conductive path; and (iii) a first capacitor having the first electrode coupled to a first side of a first oxide layer, and a third electrode coupled to a second side of the first oxide layer.

16 Claims, 13 Drawing Sheets

US 9,368,206 B1

CAPACITOR ARRANGEMENTS USING A RESISTIVE SWITCHING MEMORY CELL STRUCTURE

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

Embodiments of the present invention relate to a resistive switching memory device that may be partially or wholly configured as a capacitor. Particular embodiments are suitable for resistive switching memories, such as resistive random-access memory (ReRAM) and/or conductive bridging RAM (CBRAM) memory cells and/or capacitors.

In one embodiment, a capacitive circuit can include: (i) a resistive storage element having a solid electrolyte, a first electrode coupled to a first side of the solid electrolyte, and a second electrode coupled to a second side of the solid electrolyte; (ii) the resistive storage element being configured to be programmed to a low resistance state by application of a program voltage in a forward bias direction to form a conductive path between the first and second electrodes, and being configured to be erased to a high resistance state by application of an erase voltage in a reverse bias direction to substantially dissolve the conductive path; and (iii) a first capacitor having the first electrode coupled to a first side of a first oxide layer, and a third electrode coupled to a second side of the first oxide layer.

In one embodiment, a capacitive circuit can include: (i) a resistive storage element having a solid electrolyte, a first electrode coupled to a first side of the solid electrolyte, and a second electrode coupled to a second side of the solid electrolyte; (ii) the resistive storage element being configured to be programmed to a low resistance state by application of a program voltage in a forward bias direction to form a conductive path between the first and second electrodes, and being configured to be erased to a high resistance state by application of an erase voltage in a reverse bias direction to substantially dissolve the conductive path; and (iii) the resistive storage element being biased in the reverse bias direction to be configured as a capacitor.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Arrangement

Particular embodiments may be directed to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
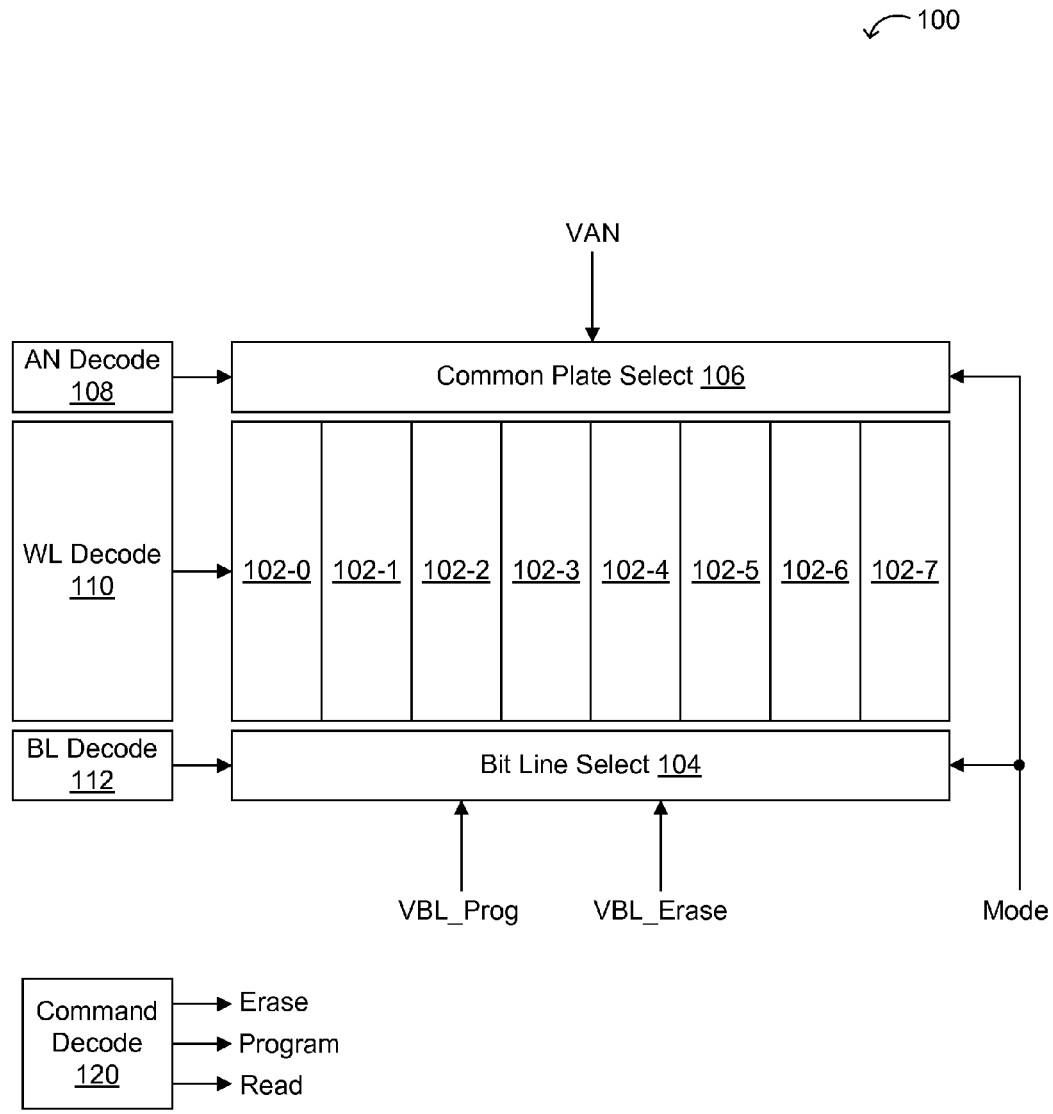
FIG. 1 is an example memory device arrangement.
Figure 2:
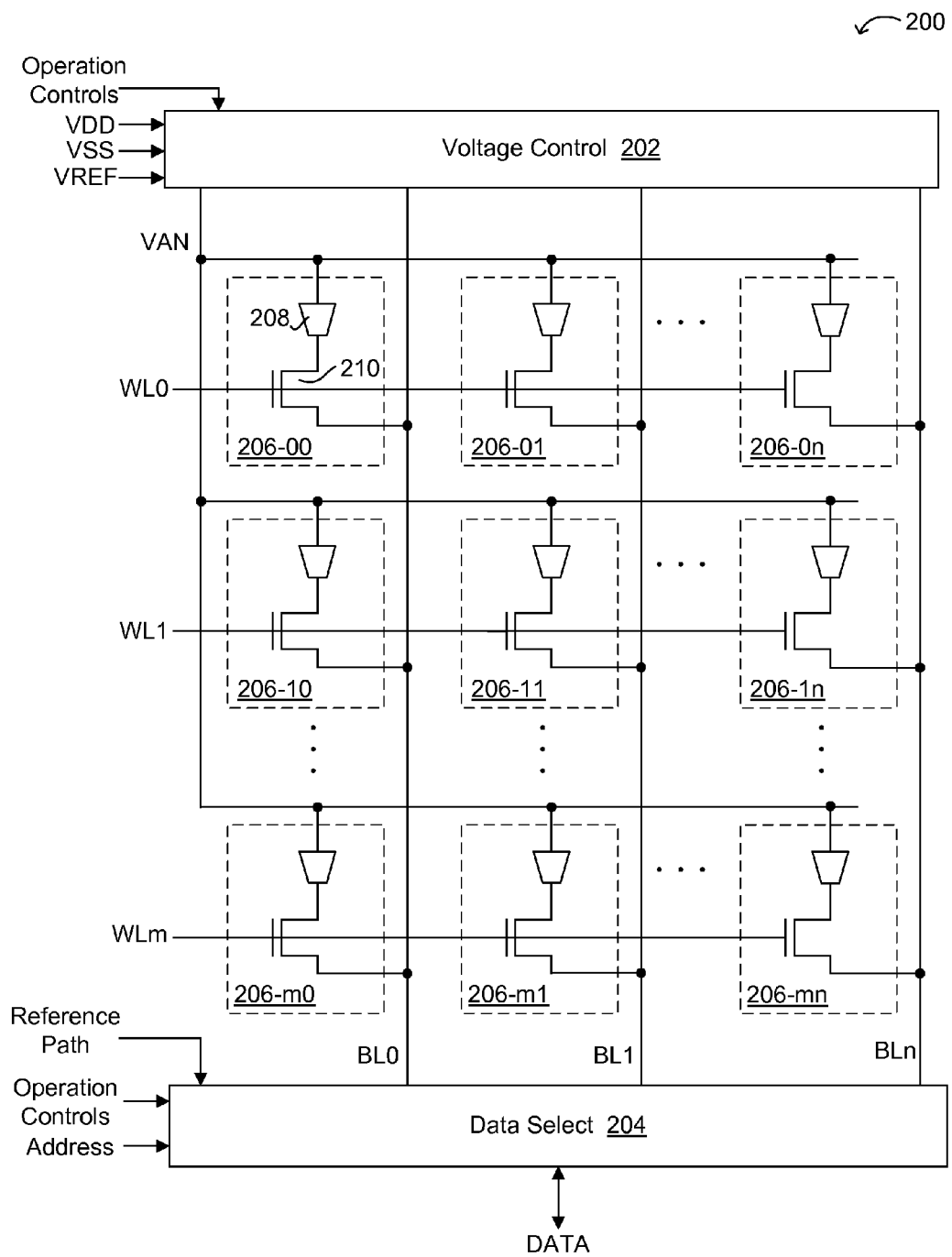
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such as +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode (AN) can be a large plate structure that may be biased at a voltage VAN generated by voltage control 202. Of course, other voltage generation control and regulated levels, as discussed above, can be utilized in certain embodiments.

Thus as shown in this particular example, common anode plates (VAN) can be shared by multiple CBRAM cells. Along these lines, each memory array or array block may have multiple such anode plates (VANs). In addition, word lines and bit lines can be arranged in an orthogonal fashion for accessing individual CBRAM or other such resistive memory cells. Of course, any number of anode plates, anode plate voltages (VANs), memory array or array block sizes, and/or memory array arrangements, etc., can be supported in particular embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a deselect voltage (e.g., low) by associated word line drivers. Bit line selection circuitry 104 can place bit lines BL0 and BL1 in the deselected state. Similarly, common plate selection circuitry 106 can place common anode plates in the deselect state.

In a program operation, in response to address and mode data, bit line selection signals can be used to connect a selected bit line to read/write control circuitry via data select 204. In contrast, other bit lines can be deselected, and thus placed in the deselected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
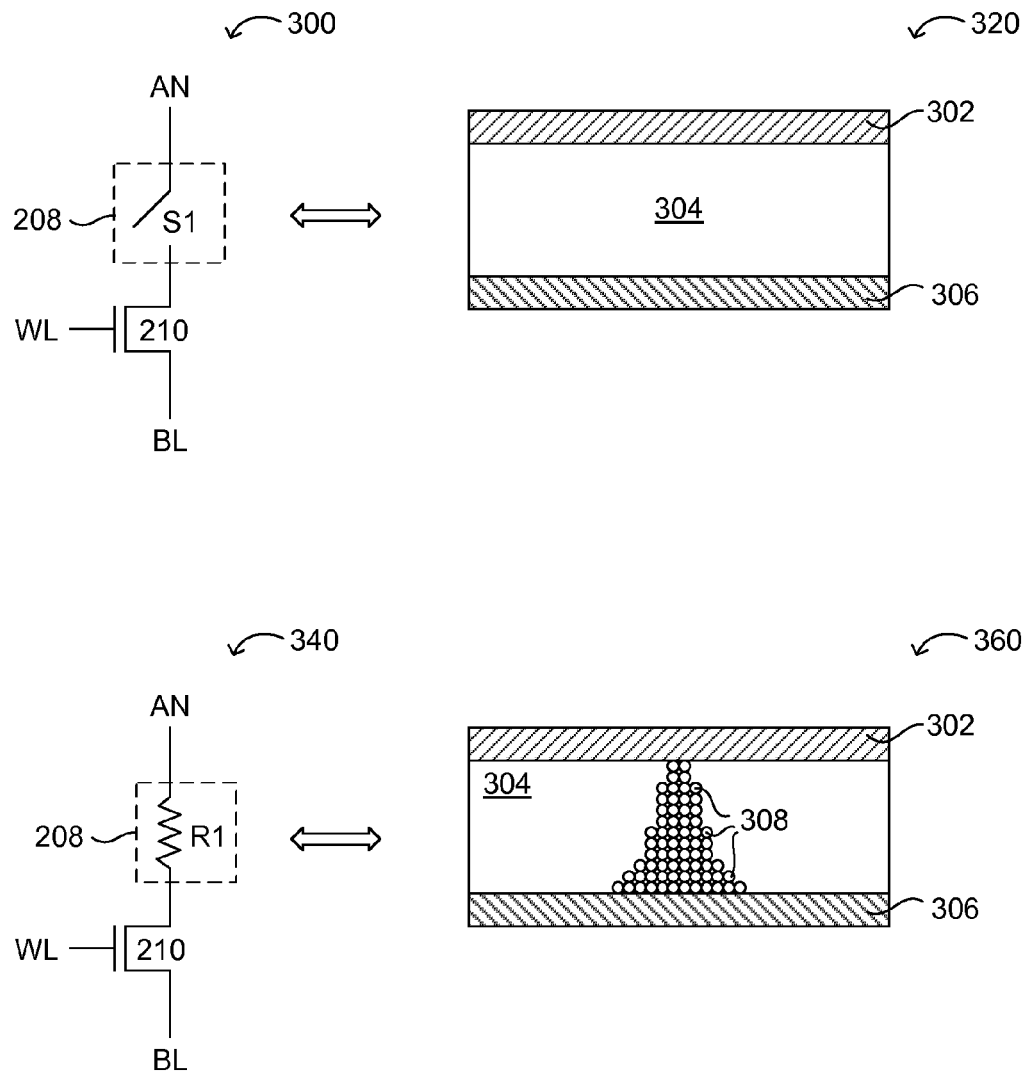
FIG. 3 is a diagram of an example programmable impedance element with schematic modeling.

Referring now to FIG. 3, shown is a diagram of an example programmable impedance element with schematic modeling. For example, example 300 shows a memory cell with an open switch 51 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example Resistive Switching Memory Based Capacitor Structures

On-chip capacitors are useful in a wide variety of circuit applications. A capacitor can be used as a power supply stabilization capacitor, a load capacitor at an output of a low-dropout (LDO) regulator, CBRAM program/erase reservoir capacitors, and pump capacitors in a charge pump, to name just a few examples. However, capacitors may take up a relatively large portion of circuit area in many cases. In certain embodiments, capacitors can be formed from resistive memory elements themselves, from portions of such resistive memory elements, and may be part of a boundary (e.g., surrounding a used memory array) or other unused (e.g., for standard program and erase operations) memory array portion.

In one embodiment, a capacitive circuit can include: (i) a resistive storage element having a solid electrolyte, a first electrode coupled to a first side of the solid electrolyte, and a second electrode coupled to a second side of the solid electrolyte; (ii) the resistive storage element being configured to be programmed to a low resistance state by application of a program voltage in a forward bias direction to form a conductive path between the first and second electrodes, and being configured to be erased to a high resistance state by application of an erase voltage in a reverse bias direction to substantially dissolve the conductive path; and (iii) a first capacitor having the first electrode coupled to a first side of a first oxide layer, and a third electrode coupled to a second side of the first oxide layer.

Figure 4:
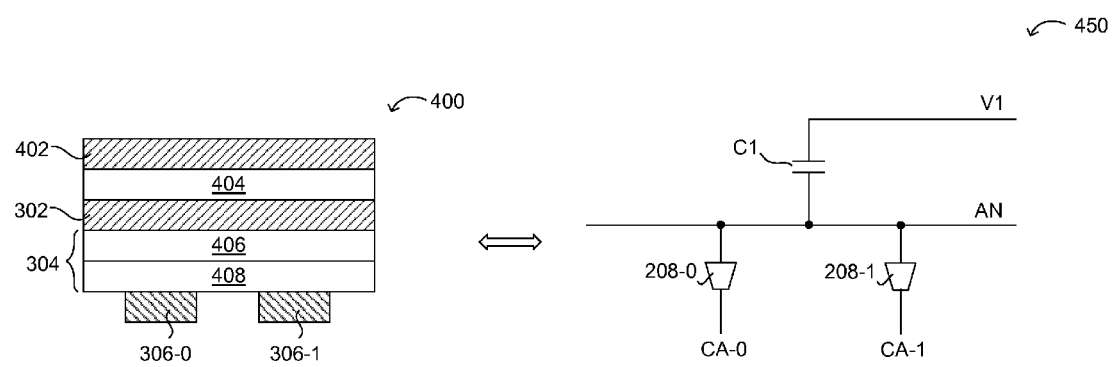
FIG. 4 is a diagram of an example resistive switching memory storage element with an anode plate shared with a capacitor, in accordance with embodiments of the present invention.

Referring now to FIG. 4, shown is a diagram of an example resistive switching memory storage element with an anode plate shared with a capacitor, in accordance with embodiments of the present invention. In other configurations, a cathode of a resistive storage element (e.g., a CBRAM element) may be shared with a capacitor. In this particular example 400, two separate resistive storage elements can be formed with cathodes 306-0 and 306-1. For example, cathode 306 can include tungsten. Also in this example, solid electrolyte 304 can include a multilayer structure of an injection barrier layer (IBL) 406 and a metal oxide 408. However, any suitable form or structure of solid electrolyte 304 can be supported in particular embodiments.

Anode plate 302 can be a common plate among a group or array of resistive storage elements. In this example, as shown in corresponding diagram 450, anode plate 302 (AN) can be shared among resistive storage elements 208-0 and 208-1. Thus, cathode CA-0 may correspond to metal electrode 306-0, and cathode CA-1 may correspond to metal electrode 306-1. In this way, two or more resistive storage elements can be formed sharing a same anode plate. In particular embodiments, a capacitive structure can be formed that also shares the common anode plate 302/AN. Here, capacitor C1 can be formed by a shared electrode 302 on one side of oxide layer 404, with electrode 402 on the opposite side of oxide layer 404. As shown in diagram 450, a voltage at one terminal of capacitor C1 can be voltage V1, while the other terminal of capacitor C1 can connect to the common anode plate. In addition, while the particular structure shown in FIG. 4 involves a common anode plate capacitor, certain embodiments can also support a common cathode capacitive structure.

Figure 5:
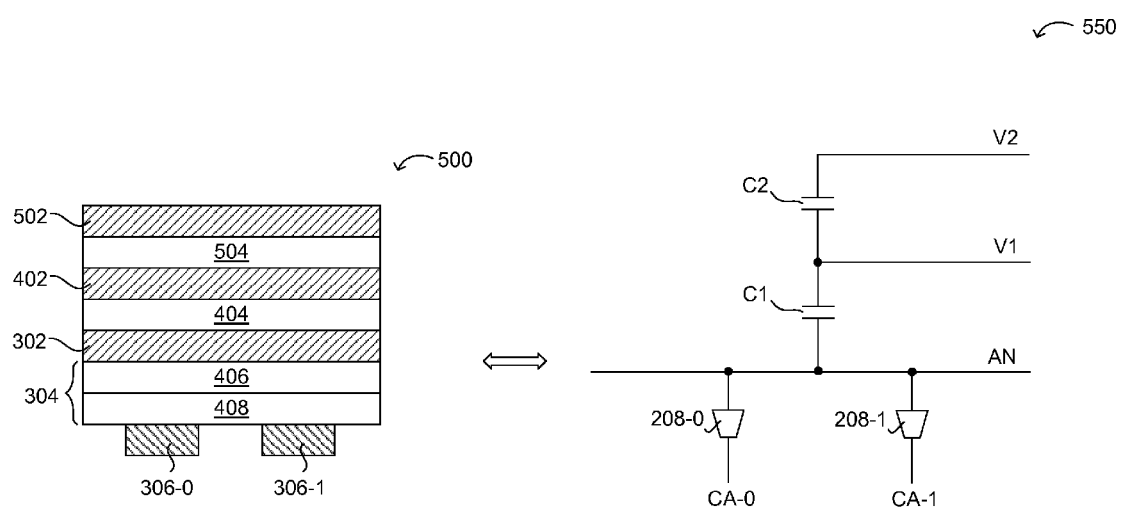
FIG. 5 is a diagram of an example resistive switching memory storage element with an anode plate shared with a multilayered capacitor, in accordance with embodiments of the present invention.

Referring now to FIG. 5, shown is a diagram of an example resistive switching memory storage element with an anode plate shared with a multilayered capacitor, in accordance with embodiments of the present invention. In this example, a second capacitor can be formed by sharing metal layer 402 with capacitor C1. As shown in 500, a series stack of capacitors can include capacitor C2 with shared metal layer 402, oxide layer 504, and metal layer 502. An example corresponding circuit diagram shown in 550 includes capacitor C1 connected between the anode plate and V1, and capacitor C2 connected between V1 and V2.

Such a series stack of capacitors can be used to effectively increase the breakdown voltage, such as between V2 and anode plate AN. However, in other cases, a node at V2 can be connected (e.g., by way of vias and metal layer connections) to the common anode plate in order to form a parallel arrangement of capacitors C1 and C2 to increase the overall capacitance between V1 and anode plate AN. Of course, other arrangements or circuit structures including stacks of capacitors with shared electrodes or metal layers to a resistive storage element, can be supported in particular embodiments. For example, while two capacitors are shown in this example, more than two (e.g., three, four, etc.) capacitors can be formed by stacking other oxide and metal layers on top of the previous layers.

In this way, metal-insulator-metal (MIM) capacitors can be formed by sharing at least one electrode or metal layer with a resistive memory storage element (e.g., a CBRAM element).

In addition, the resistive memory technology (e.g., CBRAM) can be configured to be employed as a capacitor or capacitive element itself. For example, a CBRAM structure can essentially be configured as a relatively high-k capacitor with an ion source layer, and thus can be used to form a relatively compact and high capacitance MIM capacitor (MIMCAP). However, if deposition of all stack layers in a CBRAM implementation is performed consecutively, using a non-programmed (e.g., "virgin state" or R0) memory device as a capacitor may be susceptible to programming at low voltages and/or bias times, in some cases. In other arrangements, multiple masking steps may be utilized to create areas with complete stacks (e.g., CBRAM structures) and separated metal oxide (e.g., MIMCAP) based structures.

In particular embodiments, a resistive storage element (e.g., a CBRAM element) can be reverse biased to be configured as a capacitive element. In some cases, a CV sweep can show that a capacitance of a CBRAM storage element in a reverse bias may be substantially the same as in a forward bias configuration, but the breakdown may be much higher for the reverse bias configuration. In this way, a relatively simple and low-cost MIM type of capacitor can be provided as part of a CBRAM process flow. Further, even higher breakdown voltage capacitors can be provided by cascading or series-connecting two (or more) CBRAM-based capacitors. Thus, increased voltage capability can be accommodated in a reduced capacitance/unit area structure. For example, efficiency can be improved by a factor of about 10 (e.g., about 35 $fF/um^2$ versus about 4 $fF/um^2$), in some cases. Furthermore, initial R0 values may be substantially repeatable (e.g., about 1.1 fF/via), to allow for capacitor scaling by increasing area based on array layout rules.

In one embodiment, a capacitive circuit can include: (i) a resistive storage element having a solid electrolyte, a first electrode coupled to a first side of the solid electrolyte, and a second electrode coupled to a second side of the solid electrolyte; (ii) the resistive storage element being configured to be programmed to a low resistance state by application of a program voltage in a forward bias direction to form a conductive path between the first and second electrodes, and being configured to be erased to a high resistance state by application of an erase voltage in a reverse bias direction to substantially dissolve the conductive path; and (iii) the resistive storage element being biased in the reverse bias direction to be configured as a capacitor.

Figure 6:
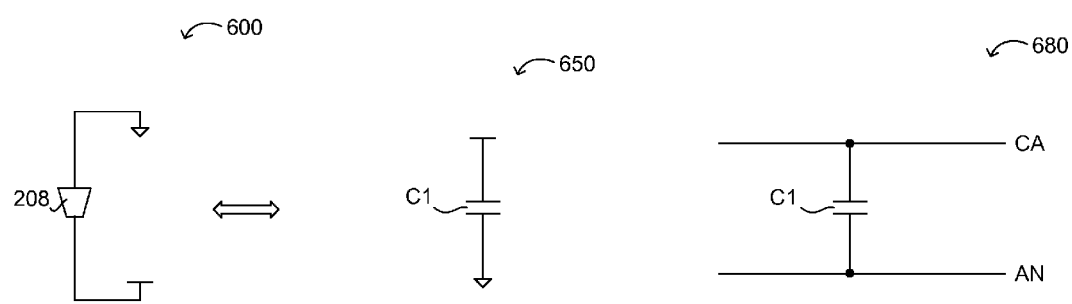
FIG. 6 is a diagram of an example resistive switching memory storage element reverse biased to be configured as a capacitor, in accordance with embodiments of the present invention.

Referring now to FIG. 6, shown is a diagram of an example resistive switching memory storage element reverse biased to be configured as a capacitor, in accordance with embodiments of the present invention. In example 600, a resistive memory element 208 (e.g., a CBRAM element) can be in a reverse bias configuration with its anode connected to a low voltage (e.g., VSS), and its cathode connected to a high voltage (e.g., VDD). Corresponding capacitor C1 is shown in diagram 650, and a more generalized configuration is shown in example 680, where the cathode can be biased higher than the anode.

This reverse bias configuration can avoid potential programming that may occur when the cell is biased in a forward direction. In addition, a relatively high breakdown voltage (e.g., up to about 100V) in such a reverse bias direction can be supported. In some cases, a forward CV sweep may show formation or breakdown sooner than the corresponding reverse bias situation, which can hold its value for about 500 mV longer, and leakage and resistance values may follow the same trends of better capacitance performance in the reverse bias configuration. In one very particular case, the capacitance of such an arrangement (e.g., at a reverse DC bias of about 1V) can remain substantially unchanged at about 1 fF/via from 10 kHz to 1 MHz. It should be noted that by utilizing an existing resistive memory element in this fashion, a capacitor structure can be formed without additional masks or other processing steps.

Figure 7:
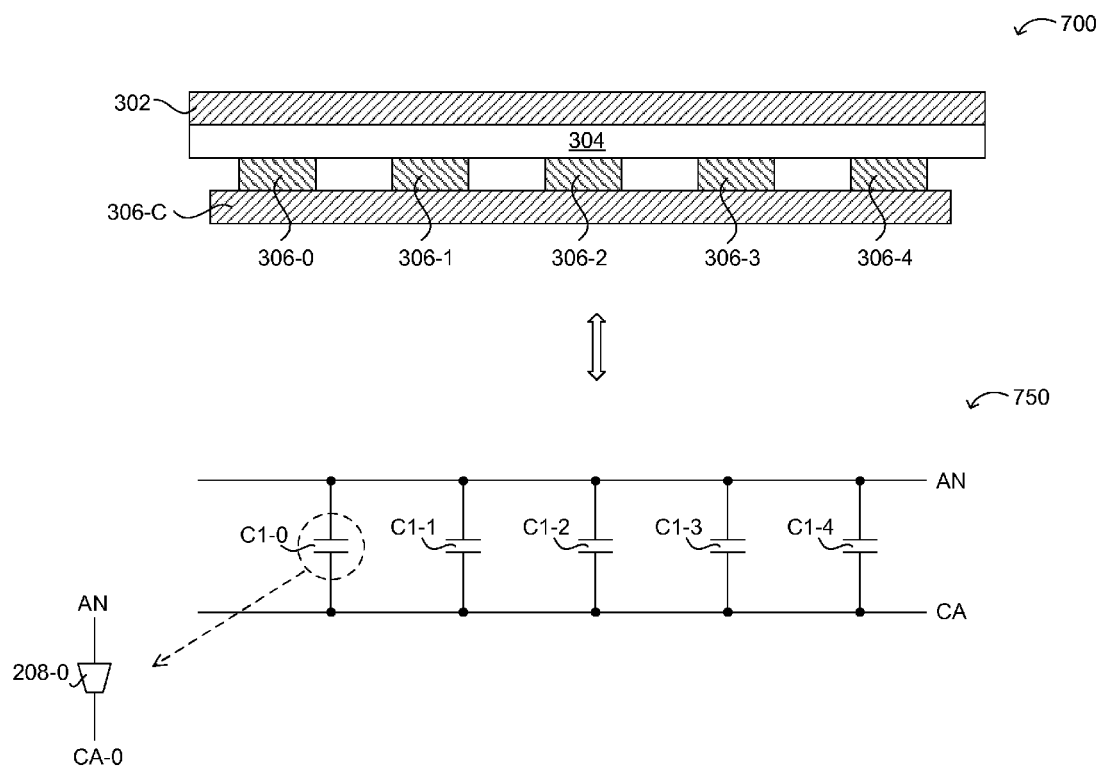
FIG. 7 is a diagram of an example resistive switching memory storage element grouping configured as capacitors, in accordance with embodiments of the present invention.

Referring now to FIG. 7, shown is a diagram of an example resistive switching memory storage element grouping configured as capacitors, in accordance with embodiments of the present invention. In example 700, shown is a grouping of resistive storage elements (e.g., CBRAM elements) with connection 306-C between cathodes 306 (e.g., 306-0, 306-1, 306-2, 306-3, 306-4, etc.). In some cases, connection 306-C can be in a same metal layer as cathodes 306 (e.g., 306-0, 306-1, 306-2, 306-3, 306-4, etc.), while in other cases, connection 306-C can be in a different metal layer, such as a lower metal layer. As shown, connection 306-C is in an immediate lower metal layer, but those skilled in the art will recognize that other layers (e.g., insulating layers) can be included between connection 306-C and cathodes 306, and that vias or other inter-layer connections can also be included to form the connections between 306-C and cathodes 306. Connection 306-C can be any type of metal connector(s), and may include tungsten. In this way, CBRAM-based capacitors can be formed with parallel connections.

As shown in circuit example 750, parallel capacitors (e.g., C1-0, C1-1, C1-2, C1-3, C1-4, etc.) can be formed between anode (AN) and cathode (CA) nodes. As discussed above, such capacitors can be in a reverse bias configuration whereby the cathode connection (e.g., CA-0 for storage element 208-0) can be at a higher voltage level than the anode connection (e.g., AN). Further, while parallel capacitor connections are shown in the example of FIG. 7, series connections can alternatively (or additionally) be formed, such as to increase overall breakdown voltage of the capacitive element.

Figure 8:
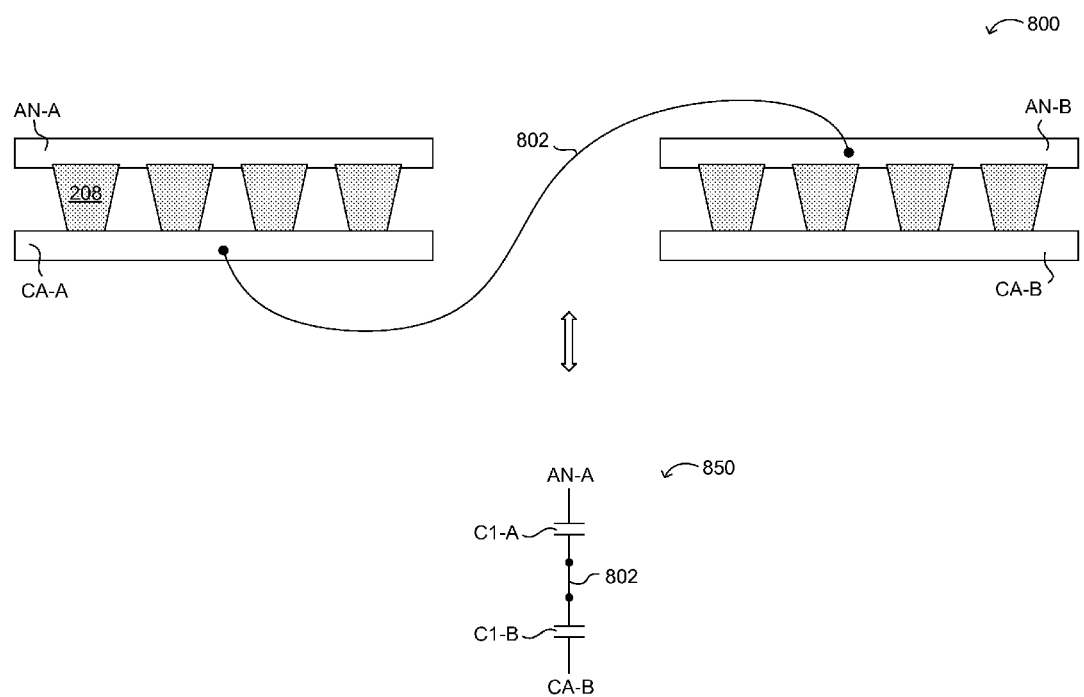
FIG. 8 is a diagram of an example resistive switching memory storage element capacitor grouping with a stacked capacitor configuration, in accordance with embodiments of the present invention.

Referring now to FIG. 8, shown is a diagram of an example resistive switching memory storage element capacitor grouping with a stacked capacitor configuration, in accordance with embodiments of the present invention. As shown in example 800, a grouping including CBRAM-based capacitive elements between anode AN-A and cathode CA-A can be connected in series with a grouping including CBRAM-based capacitive elements between anode AN-B and cathode CA-B. For example, connecting wire 802 can include various via and metal layers to form the connection. Schematic 850 shows the series connection of capacitors C1-A and C1-B to increase the effective breakdown voltage between AN-A and CA-B. Of course, other configurations, such as the number of capacitive elements in a parallel grouping, as well as a parallel connection of the two groupings, and/or other series arrangements, can also be supported in particular embodiments.

Figure 9A:
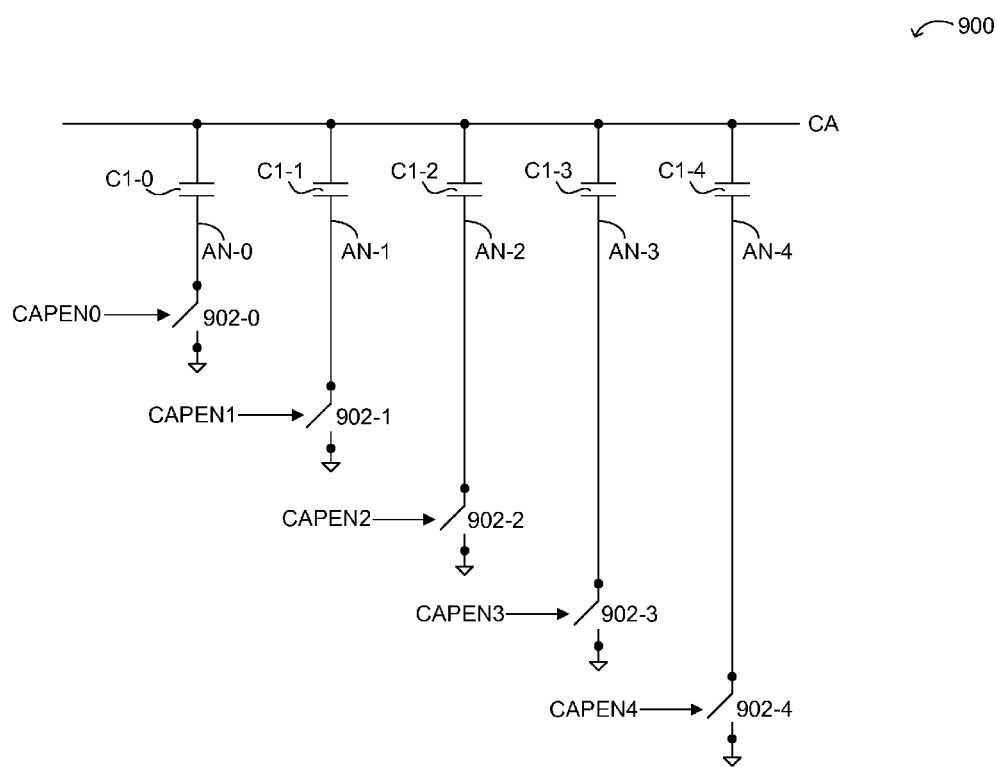
FIG. 9A is a diagram of a first example resistive switching memory storage element based capacitor enable control, in accordance with embodiments of the present invention.

Referring now to FIG. 9A, shown is a diagram 900 of a first example resistive switching memory storage element based capacitor enable control, in accordance with embodiments of the present invention. In some cases, a particular resistive storage element based capacitor may have a leakage that is too high for a given application. For example, a resistive storage element configured as a capacitor may have a leakage that is greater than a predetermined amount (e.g., a resistance less than a predetermined amount), thus indicating a defect that may be represented as a partial programming of the memory cell. As a result of such leakage, a capacitor formed therefrom may increase power consumption, or otherwise produce circuit effectiveness in which the capacitor is applied.

In particular embodiments, resistive storage element based capacitors can be broken into relatively small units (e.g., one or a group of storage elements) and segmented or otherwise individually controlled such that a defective or leaky capacitive unit can be disabled. As an example of such segmenting, the individual anodes (e.g., AN-0, AN-1, AN-2, AN-3, AN-4, etc.) are shown as separated (e.g., by usual connections being unmade) to segment or compartmentalize the capacitive elements. In this particular example, capacitor portions (e.g., C1-0, C1-1, C1-2, C1-3, C1-4, etc.) can be separately controlled by way of corresponding switches (e.g., NMOS transistors). Of course, other ways of separating or forming groups or portions of capacitors can also be accommodated in certain embodiments.

In this particular case, an overall capacitance between common cathode (CA) and ground (e.g., VSS) can be provided with a reverse bias on the resistive storage element based capacitors. Switches (e.g., 902-0, 902-1, 902-2, 902-3, 902-4, etc.) can connect (e.g., via drains of transistors) to corresponding anode sides of each corresponding capacitors (e.g., C1-0, C1-1, C1-2, C1-3, C1-4, etc.). Each switch can be controlled by a given capacitor enable signal (e.g., CAPEN0, CAPEN1, CAPEN2, CAPEN3, CAPEN4, etc.) such that a corresponding capacitor can be effectively disabled by opening (e.g., bringing CAPEN low) the appropriate switch. For example, if capacitor C1-2 is determined to have excessive leakage and is to be disabled, CAPEN2 may be low to open switch 902-2 to disable a discharge path to ground. For capacitors that do not exhibit such leaky characteristics, the corresponding CAPEN signals may be high to close the appropriate switches. In this way, leaky or otherwise defective capacitors or capacitor portions can be disabled in order to reduce or minimize effects on overall circuit operation.

Figure 9B:
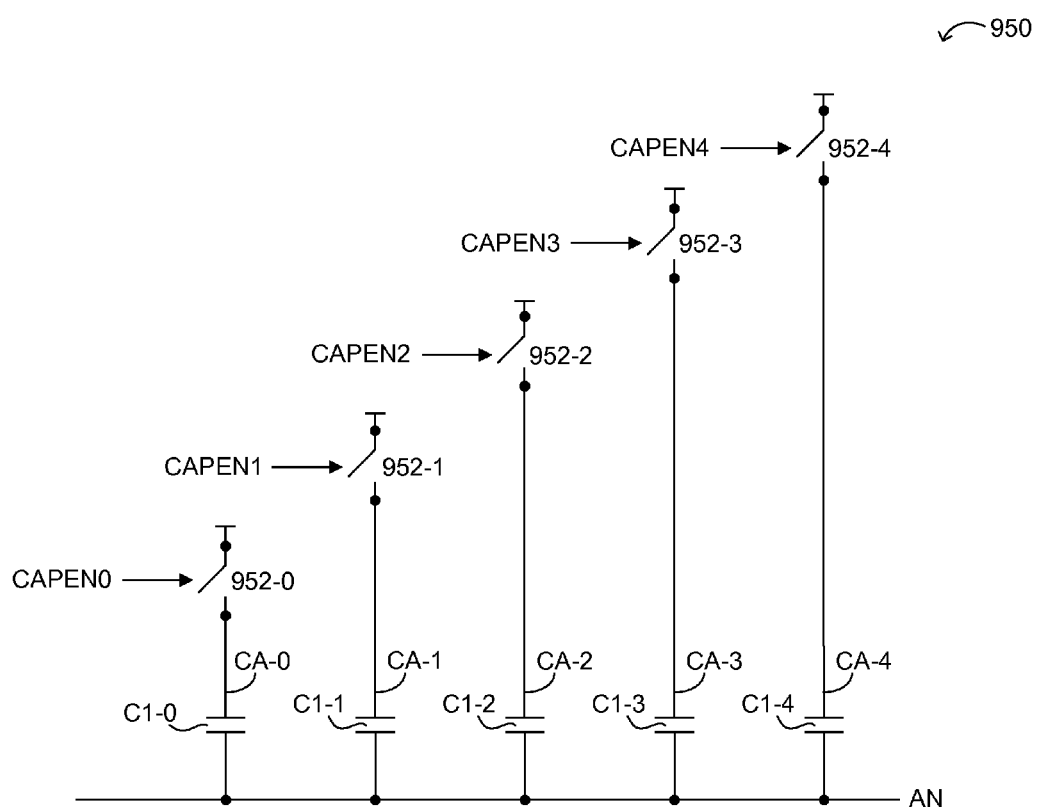
FIG. 9B is a diagram of a second example resistive switching memory storage element based capacitor enable control, in accordance with embodiments of the present invention.

Referring now to FIG. 9B, shown is a diagram 950 of a second example resistive switching memory storage element based capacitor enable control, in accordance with embodiments of the present invention. Also in this example, resistive storage element based capacitors can be broken into relatively small units (e.g., one or a group of storage elements) and segmented or otherwise individually controlled such that a defective or leaky capacitive unit can be disabled. However, in this case, the enable control transistors can connect to separated cathodes instead of anodes. As an example of such segmenting, the individual cathodes (e.g., CA-0, CA-1, CA-2, CA-3, CA-4, etc.) are shown as separated (e.g., by usual connections being unmade) to segment or compartmentalize the capacitive elements. In this example, capacitor portions (e.g., C1-0, C1-1, C1-2, C1-3, C1-4, etc.) can be separately controlled by way of corresponding switches (e.g., PMOS transistors). Of course, other ways of separating or forming groups or portions of capacitors can also be accommodated in certain embodiments.

In this particular case, an overall capacitance between common anode (AN) and a supply (e.g., VDD) can be provided with a reverse bias on the resistive storage element based capacitors. Switches (e.g., 952-0, 952-1, 952-2, 952-3, 952-4, etc.) can connect (e.g., via drains of transistors) to corresponding cathode sides of each corresponding capacitors (e.g., C1-0, C1-1, C1-2, C1-3, C1-4, etc.). Each switch can be controlled by a given capacitor enable signal (e.g., CAPEN0, CAPEN1, CAPEN2, CAPEN3, CAPEN4, etc.) such that a corresponding capacitor can be effectively disabled by opening (e.g., bringing CAPEN low) the appropriate switch. For example, if capacitor C1-2 is determined to have excessive leakage and is to be disabled, CAPEN2 may be low to open switch 952-2 to disable a charge path from the supply. For capacitors that do not exhibit such leaky characteristics, the corresponding CAPEN signals may be high to close the appropriate switches. In this way, leaky or otherwise defective capacitors or capacitor portions can be disabled in order to reduce or minimize effects on overall circuit operation.

In particular embodiments, capacitor enable signals CAPEN can be generated in any suitable fashion. In some cases, testing and/or characterization can determine defective capacitors, and such capacitors can be disabled via the suitable CAPEN signals. In order for these settings to be maintained through power up and down cycles, their configuration settings may be stored in a suitable non-volatile memory location, as will be discussed in more detail below. Also, a variety of testing, commands, and user interface control, can also be supported for adjusting capacitor enable signaling in particular embodiments.

Figure 10:
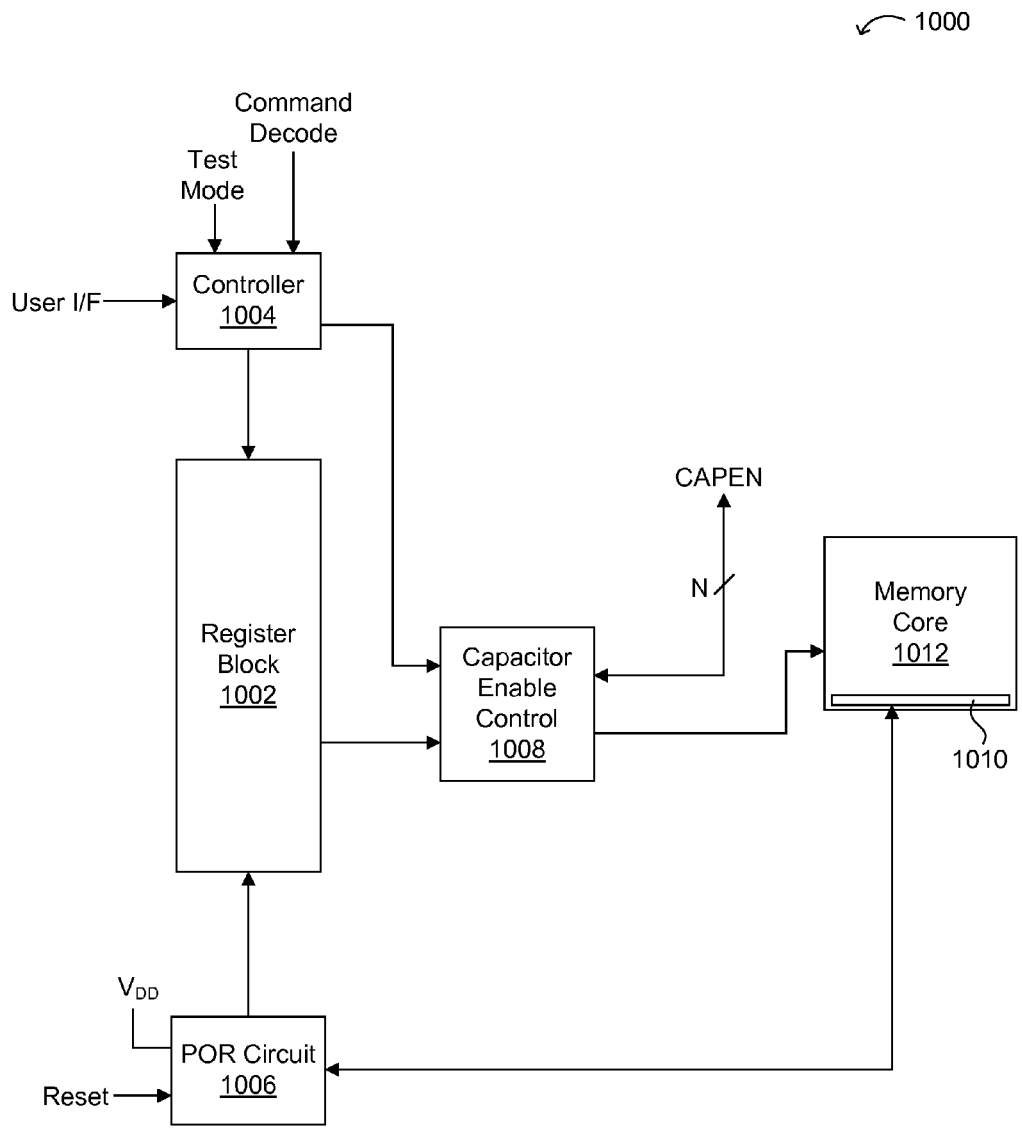
FIG. 10 is a schematic block diagram of an example register, control, and memory array structure, in accordance with embodiments of the present invention.

Referring now to FIG. 10, shown is a schematic block diagram 1000 of an example register, control, and memory array structure, in accordance with embodiments of the present invention. For example, register block 1002 can be implemented using static random access memory (SRAM). Register block 1002 can provide data or selections to capacitor enable control 1008 for generation of the capacitor enable signals. Controller 1004 may determine and decode the received command, and can also control access to the register bits in register block 1002. In addition, test modes (e.g., to determine distribution, etc.) can be used to override data in register block 1002. Settings for register block 1002 may be based on various default settings, but can also be programmed on lot-by-lot or device-by-device basis. Also, additional values for program operations, erase operations, or other condition settings, can be independently programmed in register block 1002.

Power on reset (POR) circuitry or state machine 1006, which can receive a reset signal, can access designated register data portion 1010 and read out data from that dedicated section of memory array 1012. Designated register data portion 1010 may alternatively be located outside of memory core 1012. In any event, this accessed data that is associated with memory core 1012 may then be loaded into register block 1002. In this way, information specific to this device can be programmed into the memory core, and whenever the device is powered on (e.g., as detected by VDD supply) or otherwise reset, this data can be loaded into register 1002. This is because the memory core, including designated register data portion 1010 may include non-volatile memory. Also, different applications-based information can be stored in non-volatile memory designated register data portion 1010. Further, different parts or memory cores 1012 can be independently programmed (e.g., for different applications, etc.). In some cases, this dedicated portion of memory may not be accessible to the user. However, some applications may allow access to these designated locations, such as in a test mode.

Also, the non-volatile memory cells in designated register data portion 1010 may be substantially identical to those in a remaining portion of memory core 1012. For example, memory core 1012 can include a plurality of memory cells that each can include a programmable impedance element or PMC/CBRAM structure. However, in some cases there may be some variety between the cells (e.g., programmable impedance element-based cells) of designated register data portion 1010 relative to the cells found in other portions of memory core 1012. For example, the cells of designated register data portion 1010 may have a substantially similar structure relative to the other cells, but in order to accommodate higher retention for the critical data stored therein, the cells of designated register data portion 1010 may be varied so as to provide improved data retention capabilities.

In one or more test modes, controller 1004 can override one or more values stored in register 1002. When the test mode is complete, data in register block 1002 can revert to the data that was previously stored in the register. For example, registers 1002 may be implemented as two storage bits per register cell, one such bit representing an override value that is only enabled during predetermined modes (e.g., test mode, etc.), and another bit storing the data programmed outside of the test mode (e.g., during normal operation, power up, etc.). As another example, registers 1002 may be implemented as a single bit per cell or stored data bit, and data can be reverted to its previous state by accessing designated register data portion 1010 and asserting the reset signal upon completion of the test mode.

In addition, registers 1002 may be programmable by controller 1004 and/or by a user via a separate or combined user interface. In this way, a user may be able to program data into registers 1002 in order to override or change previous values therein. Particular embodiments may also support independently controlled capacitor enable selections for different memory cores 1012. For example, controller 1004 can set the register values in 1002 different for different memory cores 1012. For example, register block 1002 may include dedicated sectors (e.g., a widened register or increased register bit length) for each memory core, or register block 1002 may be replicated for each memory core 1012. This may be utilized whereby one memory array 1012 is dedicated to one application (e.g., code) or is associated with a certain type of peripheral circuitry, while another memory array 1012 may be dedicated to another application (e.g., data) or other type of peripheral circuitry. In this way, register block 1002 may accommodate independently programmable capacitor enabling, in support of different operations for circuits associated with different memory cores 1012.

Figure 11:
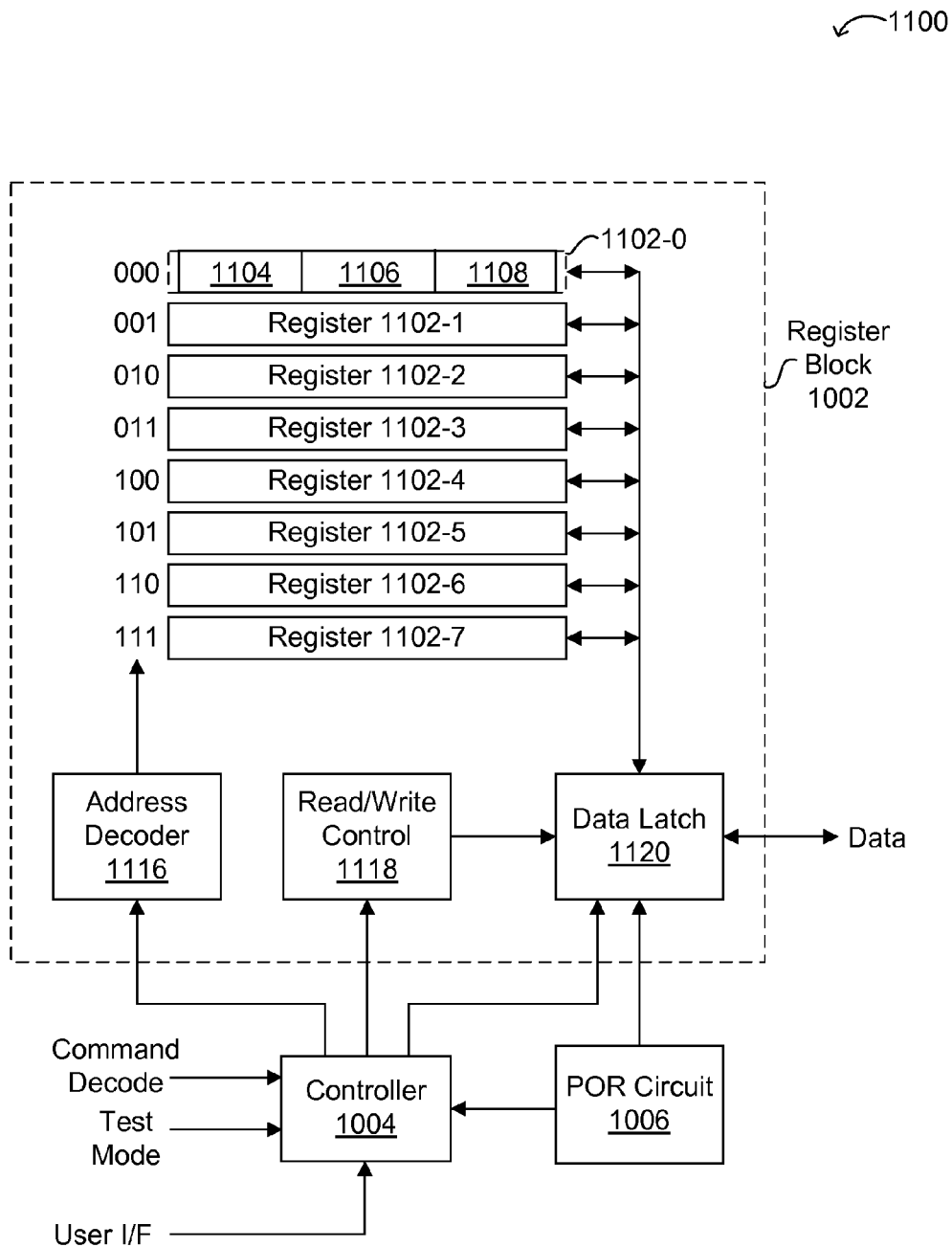
FIG. 11 is a schematic block diagram of an example register control structure, in accordance with embodiments of the present invention.

Referring now to FIG. 11, shown is a schematic block diagram 1100 of an example register control structure, in accordance with embodiments of the present invention. In this example, register block 1002 can include eight registers 1102 (e.g., 1102-0, 1102-1, ... 1102-7). Each register 1102 can include a number of fields. For example, fields 1104, 1106, and 1108 may store data representing address or mappings to different capacitor locations. For example, field 1104 may be a 2-bit wide field to store data representing a chip top/bottom half for capacitor mapping. Also for example, field 1106 may be a 2-bit wide field to store data representing a chip left/right half for capacitor mapping. Also for example, field 1108 may be a 2-bit wide field to store data representing leaky state indications. Other fields (not shown) may be used to indicate or set other conditions or variables. Various fields of registers 1102 may generally be used to form or support a table that may be accessed (e.g., by capacitor enable control 1008, etc.) to set the states of the capacitor enable signals.

Register block 1002 can also include address decoder 1116, which can receive signals (e.g., address, address load, etc.) from controller 1004, and may provide 3-bit decoded values to address one of eight registers 1102. Read/write control 1118 can receive signals (e.g., read control signal, write control signal, etc.) from controller 1004, and may provide a control signal to data latch 1120. Data latch 1120 can receive signals (e.g., read data strobe, data out enable, load data, etc.) from controller 1004, and may receive or provide the data to/from register block 1002. Also, while only eight registers are shown in the particular example of FIG. 11, any suitable number of registers can be accommodated in particular embodiments. For example, 24 registers can be included, where each register is 8-bits wide. In addition, such registers may support other programmable impedance device-based functions, such as word line voltage level, compliance current (e.g., where the cell is programmed until reaching this compliance current, $X\,\mu A$), program/erase algorithm selection, equalization pulse width, single ended or differential sense amplifier configuration, as well as any number of other device functions and/or parameters.

Figure 12:
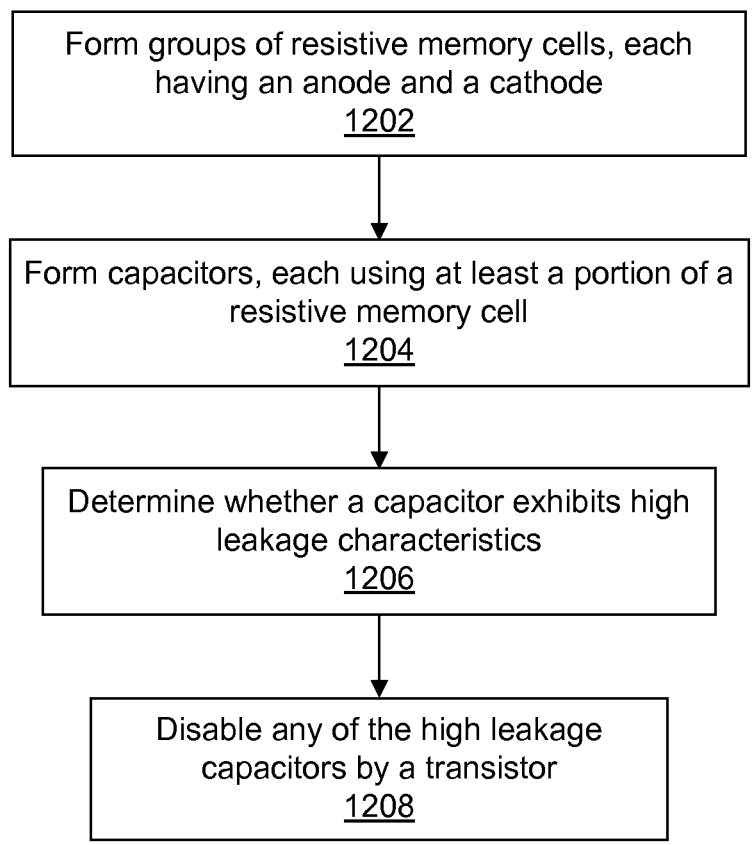
FIG. 12 is a flow diagram of an example method of controlling capacitor portion enabling for resistive switching memory storage element based capacitors, in accordance with embodiments of the present invention.

Referring now to FIG. 12, shown is a flow diagram 1200 of an example method of controlling capacitor portion enabling for resistive switching memory storage element based capacitors, in accordance with embodiments of the present invention. At 1202, groups of resistive memory cells can be formed. For example, a plurality of resistive storage elements can be connected in parallel to form a group. At 1204, capacitors can be formed, such as by sharing a common metal electrode (see, e.g., FIGS. 4 and 5) or by placing a reverse bias configuration on a resistive storage element (see, e.g., FIG. 6). At 1206, whether a capacitor or capacitor group exhibits a high leakage characteristic can be determined. For example, testing and/or characterization can be performed to determine leakage characteristics for a particular capacitor or group, and data representing such characteristics can be stored in designated register data portion 1010. At 1208, any of the high leakage capacitors can be disabled by use of a transistor. For example, switches (e.g., transistors) 902 can be controlled by capacitor enable signals CAPEN (e.g., from capacitor enable control 1008), to enable or disable a particular capacitor portion/group via the corresponding switch.

Resistive switching memory cells as discussed herein may also each support more than one memory state, and corresponding different capacitance values. In addition, depending on the voltage level controls, instead of a full erase or a full program/write, partial operations (e.g., by applying less/predetermined voltages for forward bias and reverse bias of the CBRAM cell, by applying different program current, etc.) can be performed. Such partial operations can produce different resistance and linear/nonlinear values in the cell, as opposed to the cell having an on/off resistance corresponding to two storage states. Instead, a binary coding of, e.g., eight different bands or ranges of CBRAM cell on resistances can be converted into 3-bit storage values. Thus in this example, eight different data values can be stored in a given CBRAM cell. Of course, other numbers of data values can be stored based on the resistance, linearity, bias voltage, and/or current characteristics.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A capacitive circuit, comprising:
   a) a boundary cell having a resistive storage element that comprises a solid electrolyte, a first electrode coupled to a first side of the solid electrolyte, and a second electrode coupled to a second side of the solid electrolyte;
   b) a plurality of resistive switching memory cells that form a functioning memory array, wherein the boundary cell is outside of the functioning memory array;
   c) the resistive storage element being configured to be programmed to a low resistance state by application of a program voltage in a forward bias direction to form a conductive path between the first and second electrodes, and being configured to be erased to a high resistance state by application of an erase voltage in a reverse bias direction to substantially dissolve the conductive path; and
   d) a first capacitor comprising the first electrode coupled to a first side of a first oxide layer, and a third electrode coupled to a second side of the first oxide layer.

2. The capacitive circuit of claim 1, wherein the first oxide layer comprises a metal oxide.

3. The capacitive circuit of claim 1, wherein the solid electrolyte comprises:
   a) an injection barrier layer (IBL) coupled to the first electrode; and
   b) a metal oxide coupled to the second electrode.

4. The capacitive circuit of claim 1, further comprising a second capacitor having the third electrode coupled to a first side of a second oxide layer, and a fourth electrode coupled to a second side of the second oxide layer.

5. The capacitive circuit of claim 1, wherein the first electrode comprises tungsten.

6. The capacitive circuit of claim 1, wherein the resistive storage element comprises a conductive bridging random-access memory (CBRAM) storage element.

7. A capacitive circuit, comprising:
   a) a plurality of resistive storage elements, wherein each resistive storage element comprises a solid electrolyte, a first electrode coupled to a first side of the solid electrolyte, and a second electrode coupled to a second side of the solid electrolyte;
   b) each resistive storage element being configured to be programmed to a low resistance state by application of a program voltage in a forward bias direction to form a conductive path between the first and second electrodes, and being configured to be erased to a high resistance state by application of an erase voltage in a reverse bias direction to substantially dissolve the conductive path;
   c) each resistive storage element being biased in the reverse bias direction to be configured as a capacitor; and
   d) the plurality of the resistive storage elements being configured as a corresponding plurality of capacitors, wherein the plurality of capacitors are connected in parallel.

8. The capacitive circuit of claim 7, wherein the solid electrolyte comprises:
   a) an injection barrier layer (IBL) coupled to the first electrode; and
   b) a metal oxide coupled to the second electrode.

9. The capacitive circuit of claim 7, wherein the first electrode comprises tungsten.

10. The capacitive circuit of claim 7, further comprising a boundary cell that is outside of a functioning array of a plurality of resistive switching memory cells.

11. The capacitive circuit of claim 7, wherein the resistive storage element comprises a conductive bridging random-access memory (CBRAM) storage element.

12. The capacitive circuit of claim 7, wherein:
   a) a first subset of the plurality of capacitors are connected in parallel;
   b) a second subset of the plurality of capacitors are connected in parallel; and
   c) the first and second subsets of capacitors are connected in series.

13. The capacitive circuit of claim 7, further comprising a plurality of transistors, wherein each transistor is coupled between a corresponding one of the plurality of capacitors and ground.

14. The capacitive circuit of claim 13, wherein each transistor is controllable by a capacitor enable control signal.

15. The capacitive circuit of claim 14, further comprising:
   a) a memory array having a designated register data portion, wherein the memory array comprises a plurality of resistive switching memory cells; and
   b) a register configured to be programmed with data read from the designated register data portion.

16. The capacitive circuit of claim 15, wherein the capacitor enable control signal is configured to be generated using the data from the register.

* * * * *